(12) United States Patent
Yasumatsu

(10) Patent No.: US 9,030,427 B2
(45) Date of Patent: May 12, 2015

(54) FLEXIBLE DISPLAY PANEL WITH TOUCH SENSOR FUNCTION

(75) Inventor: Takuto Yasumatsu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 263 days.

(21) Appl. No.: 13/511,098

(22) PCT Filed: Nov. 9, 2010

(86) PCT No.: PCT/JP2010/069901
§ 371 (c)(1),
(2), (4) Date: May 21, 2012

(87) PCT Pub. No.: WO2011/062085
PCT Pub. Date: May 26, 2011

(65) Prior Publication Data
US 2012/0242610 A1    Sep. 27, 2012

(30) Foreign Application Priority Data
Nov. 20, 2009 (JP) .................. 2009-265529

(51) Int. Cl.
*G06F 3/041* (2006.01)
*G06F 3/045* (2006.01)
*H01L 27/32* (2006.01)

(52) U.S. Cl.
CPC ...... *G06F 3/045* (2013.01); *G06F 2203/04102* (2013.01); *G06F 2203/04103* (2013.01); *H01L 27/323* (2013.01); *H01L 2251/5338* (2013.01)

(58) Field of Classification Search
CPC ...................................................... G09F 9/302
USPC ......................................................... 345/173
See application file for complete search history.

(56) References Cited

U.S. PATENT DOCUMENTS

| | | | |
|---|---|---|---|
| 4,435,047 A | 3/1984 | Fergason | |
| 5,652,395 A * | 7/1997 | Hirano et al. | ................... 73/849 |

(Continued)

FOREIGN PATENT DOCUMENTS

| | | |
|---|---|---|
| JP | 1-138136 | 9/1989 |
| JP | 5-216017 | 8/1993 |

(Continued)

OTHER PUBLICATIONS

Doany, F. E. et al., (Jan./Mar. 1997). "Laser Release Process to Obtain Freestanding Multilayer Metal-Polyimide Circuits." *IBM J. Res. Develop.* 41(1/2);151-157.

(Continued)

*Primary Examiner* — Sahlu Okebato
(74) *Attorney, Agent, or Firm* — Keating & Bennett, LLP

(57) ABSTRACT

Provided is a display panel that has a touch sensor function, that is thin, and that has high flexibility. A plurality of sub-pixel electrodes (46) arranged in matrix and a counter electrode (35) are opposed to each other, and a pair of flexible substrates (21, 31) are opposed to each other, with the sub-pixel electrodes (46) and the counter electrode (35) being interposed therebetween. A desired display is carried out by controlling respective potentials of the plurality of sub-pixel electrodes with respect to the counter electrode. A pressure-sensitive conductive resin (48) whose electric resistance varies with a compressive force applied thereto is provided between the pair of flexible substrates. A change in a distance between the pair of flexible substrates that occurs according to a pressure applied to one of the pair of flexible substrates is detected based on a value of an electric current flowing through the pressure-sensitive conductive resin.

9 Claims, 13 Drawing Sheets

(56) References Cited

U.S. PATENT DOCUMENTS

| | | | |
|---|---|---|---|
| 5,812,227 | A | 9/1998 | Toshida et al. |
| 7,278,025 | B2 | 10/2007 | Saito et al. |
| 2006/0071819 | A1 | 4/2006 | Johnson et al. |
| 2006/0077200 | A1* | 4/2006 | Tamayama .................. 345/211 |
| 2006/0181504 | A1 | 8/2006 | Kawai |
| 2007/0085837 | A1* | 4/2007 | Ricks et al. .................. 345/173 |
| 2008/0003727 | A1 | 1/2008 | Jinbo |
| 2009/0051830 | A1 | 2/2009 | Matsushita et al. |
| 2011/0253982 | A1* | 10/2011 | Wang et al. .................. 257/24 |

FOREIGN PATENT DOCUMENTS

| | | |
|---|---|---|
| JP | 5-281521 | 10/1993 |
| JP | 11-271712 | 10/1999 |
| JP | 2002-99886 | 4/2002 |
| JP | 2005-18492 | 1/2005 |
| JP | 2006-509302 | 3/2006 |
| JP | 2006-227249 | 8/2006 |
| JP | 2006-237542 | 9/2006 |
| JP | 2008-34835 | 2/2008 |
| JP | 2009-64010 | 3/2009 |
| JP | 2009-88239 | 4/2009 |
| WO | WO-2007/077649 | 7/2007 |
| WO | WO-2008/150600 | 12/2008 |

OTHER PUBLICATIONS

French, I. et al., (2007). "58.4: *Invited Paper:* Flexible Displays and Electronics Made in AM-LCD Facilities by the EPLAR™ Process." SID 07 Digest. 1680-1683.

Holmes, A. et al., (Dec. 1998). "Sacrificial Layer Process with Laser-Driven Release for Batch Assembly Operations." *Journal of Microelectromechanical Systems.* 7(4):416-422.

Hur, J. H. et al. (2008). "30.1: Flexible Image Sensor Made of a-Si:H TFTs on Metal Foil." *SID 08 Digest* 419-421.

Suo, Z. (Feb. 22, 1999). "Mechanics of Rollable and Foldable Film-on-Foil Electronics." *Applied Physics Letters.* 74(8):1177-1179.

"ASU's Flexible Display Center Creates First Touchscreen Flexible Display." TechConnect press release. Feb. 24, 2009. 1 page.

Graham-Rowe, D. "Flexible Screens Get Touchy-Feely." Technology Review. MIT. Feb. 27, 2009. located at http://www.technologyreview.com/computing/2232/ visited Apr. 25, 2012: 4 pages.

Search Report and Written Opinion mailed Mar. 1, 2011, directed to International Patent Application No. PCT/JP2010/069901; 3 pages.

* cited by examiner

FLEXIBLE DISPLAY PANEL WITH TOUCH SENSOR FUNCTION

REFERENCE TO RELATED APPLICATIONS

This application is a national stage application under 35 USC 371 of International Application No. PCT/JP2010/069901, filed Nov. 9, 2010, which claims priority from Japanese Patent Application No. 2009-265529, filed Nov. 20, 2009, the entire contents of which are incorporated herein by reference.

FIELD OF THE INVENTION

The present invention relates to a display panel that has a touch sensor function and that has flexibility.

BACKGROUND OF THE INVENTION

Flexible displays that can be rolled or bent like paper and that have excellent portability have been developed. If a touch sensor function of inputting information by touching a display surface with a finger or a touch pen can be added further to such a flexible display, the portability of the display is improved further, since there is no need to provide a separate information input device.

JP2005-18492A discloses an information input display device that can be rolled so as to be stored. This information input display device includes a flexible image display part, and a flexible two-dimensionally-designated position input part that is laminated on an observer-side surface of the flexible image display part. The publication discloses that as the flexible two-dimensionally-designated position input part, a resistance-film-type touch panel can be used that includes a pair of resin films having position-detecting electrodes on their opposed surfaces. The publication also discloses that a liquid crystal display device, an EL (electro-luminescence) display device, an electronic paper display device, or the like can be used as the flexible image display part.

JP2006-227249 discloses a flexible electrophoretic display panel with use of microcapsules, which can be used as electronic paper. This display panel includes a pair of substrates having flexibility, and an electrophoretic layer interposed between the pair of these substrates. On each of surfaces of the substrates that are opposed to each other, electrodes are formed. The electrophoretic layer is composed of a multiplicity of microcapsules each of which contains a medium in which charged particles of one or a plurality of colors are dispersed. When an electric field is applied to the electrophoretic layer via the electrodes, the charged particles in the microcapsules move toward either one of the substrates according to the electric field. By controlling the electric field applied to the electrophoretic layer pixel by pixel, a desired display can be performed.

SUMMARY OF THE INVENTION

However, simply laminating a touch panel and electronic paper, which are flexible if they are alone each, results in an increase in the total thickness, and only such flexibility that the lamination can slightly curve can be obtained. Therefore, it is difficult to realize an information input display device that can be rolled into a cylindrical form as suggested in JP2005-18492A.

It is an object of the present invention to solve the above-described problem of the prior art, and thereby to provide a display panel that has a touch sensor function, that is thin, and that has high flexibility.

A flexible display panel with a touch sensor function of the present invention includes a plurality of sub-pixel electrodes arranged in matrix, a counter electrode opposed to the plurality of sub-pixel electrodes, and a pair of flexible substrates opposed to each other with the plurality of sub-pixel electrodes and the counter electrode being interposed therebetween, wherein the display panel performs desired display by controlling respective potentials of the plurality of sub-pixel electrodes with respect to the counter electrode, wherein a pressure-sensitive conductive resin whose electric resistance varies with a compressive force applied thereto is provided between the pair of flexible substrates, and a change in a distance between the pair of flexible substrates that occurs according to a pressure applied to one of the pair of flexible substrates is detected based on a value of an electric current flowing through the pressure-sensitive conductive resin.

With the present invention, a display panel that has a touch sensor function, that is thin, and that has high flexibility can be realized.

DETAILED DESCRIPTION OF THE INVENTION

Figure 1:
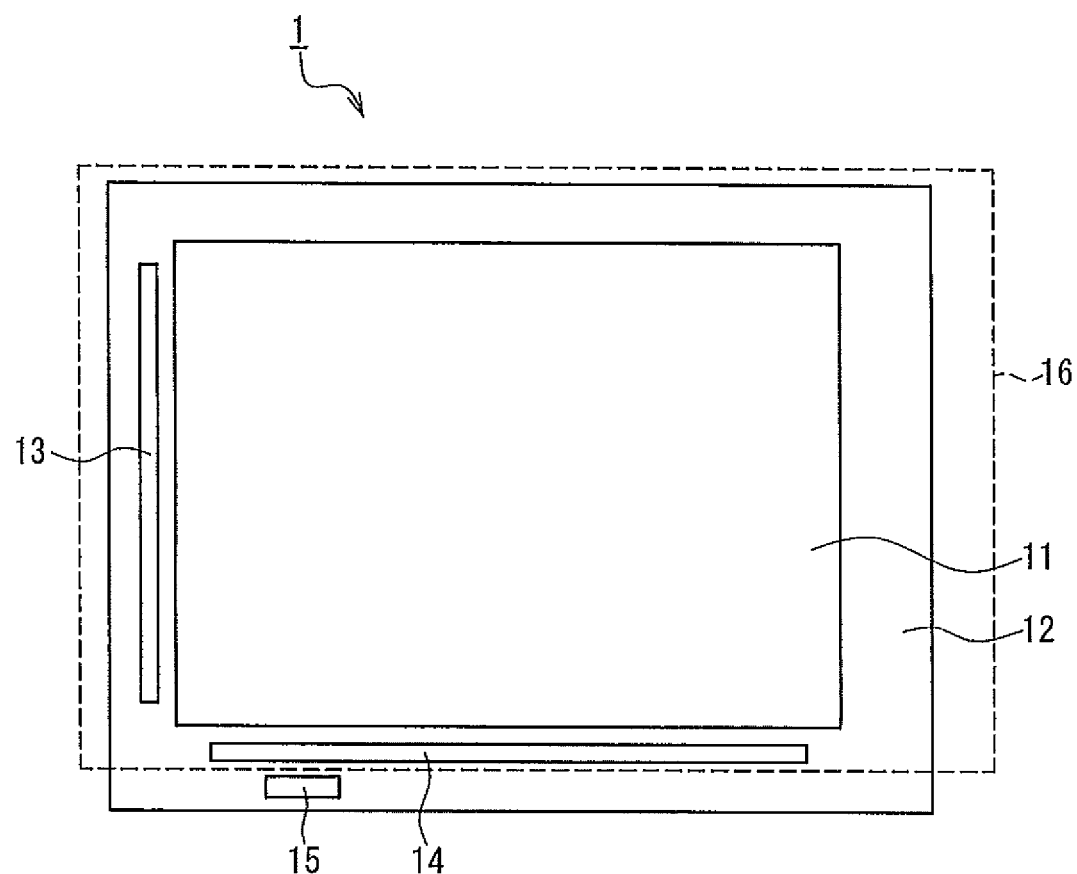
FIG. 1 is a plan view showing a schematic configuration of a liquid crystal display panel with a touch sensor function according to Embodiment 1 of the present invention.

A flexible display panel with a touch sensor function according to one embodiment of the present invention is a display panel that includes a plurality of sub-pixel electrodes arranged in matrix, a counter electrode opposed to the plurality of sub-pixel electrodes, and a pair of flexible substrates opposed to each other with the plurality of sub-pixel electrodes and the counter electrode being interposed therebetween, wherein the display panel performs desired display by controlling respective potentials of the plurality of sub-pixel electrodes with respect to the counter electrode, wherein a pressure-sensitive conductive resin whose electric resistance varies with a compressive force applied thereto is provided between the pair of flexible substrates, and a change in a distance between the pair of flexible substrates that occurs according to a pressure applied to one of the pair of flexible substrates is detected based on a value of an electric current flowing through the pressure-sensitive conductive resin (first configuration).

In the first configuration, the touch sensor may be formed with use of the pressure-sensitive conductive resin provided between the pair of flexible substrates, whereby a display panel in which touch sensors are formed as in-cell touch sensors between the pair of flexible substrates can be realized. Besides, even if a pressure-sensitive conductive resin is provided between the pair of flexible substrates, the thickness of the display panel does not increase substantially. Therefore, a display panel that has a touch sensor function, that is thin, and that has high flexibility can be realized.

In the first configuration, preferably the pressure-sensitive conductive resin is provided in a matrix form (second configuration). This enables detection of a touched position in a two-dimensional plane.

In the first or second configuration, preferably the pressure-sensitive conductive resin bonds the pair of flexible substrates (third configuration). Since the pressure-sensitive resin has such a "bonding function", it is possible to prevent the pair of flexible substrates from separating from each other, or to prevent one of the pair of flexible substrates from being displaced with respect to the other, when the display panel is curved or bent. Therefore, the high display quality can be maintained, without any degradation. Here, the "bonding" between the pressure-sensitive conductive resin and the flexible substrates implies, not exclusively the "bonding" when the pressure-sensitive conductive resin is bonded to the flexible substrates in direct contact therewith, but also the "bonding" when the pressure-sensitive conductive resin is bonded to the flexible substrates in indirect contact therewith with another layer being interposed between the pressure-sensitive conductive resin and the flexible substrates.

In any one of the first to third configurations, preferably, the pressure-sensitive conductive resin keeps the distance between the pair of flexible substrates at a predetermined value (fourth configuration). Since the pressure-sensitive conductive resin has such as "spacer function", it is possible to prevent the distance between the pair of flexible substrates from decreasing when the display panel is curved or bent. Therefore, the high display quality can be maintained, without any degradation. Besides, spacers that are used usually so as to keep a distance between a pair of flexible substrates constant can be omitted. Consequently, a process for forming the spacers becomes unnecessary.

The method for displaying images on a display panel according to one embodiment of the present invention is not limited particularly, but may be applied to display panels of various kinds such as the reflection type, the transmission type, and the self light emitting type.

For example, the display panel according to one embodiment of the present invention may be the liquid crystal display panel. Here, the liquid crystal display panel may be that of the reflection type (fifth configuration), that of the transmission type (sixth configuration), or that of the reflection-transmission type. In the case where the display panel is a liquid crystal display panel of the transmission type (fifth configuration) or a liquid crystal display panel of the reflection-transmission type, one of the pair of flexible substrates is preferably further provided with a lighting device having flexibility, the lighting device being provided on a side opposite to the other flexible substrate side (seventh configuration).

In the case where the display panel according to one embodiment of the present invention is a liquid crystal display panel, the liquid crystal provided between the plurality of sub-pixel electrodes and the counter electrode may be liquid crystal having fluidity such as twisted nematic liquid crystal or super twisted nematic liquid crystal, but it is preferably polymer dispersion liquid crystal (eighth configuration). The use of polymer dispersion liquid crystal makes polarizer unnecessary. Consequently, a bright wide-view-angle display can be achieved. Further, the display panel can be thinned. Still further, an alignment film is made unnecessary.

As the polymer dispersion liquid crystal, polymer network liquid crystal, or guest-host liquid crystal can be used.

Alternatively, the display panel according to one embodiment of the present invention may be an electrophoretic display panel, or an organic EL display panel (ninth and tenth configurations).

Hereinafter, the present invention is explained in detail, with reference to preferable embodiments thereof. Needless to say, however, the present invention is not limited to the embodiments described below. The drawings referred to hereinafter show, in a simplified manner, only principal members needed for explanation of the present invention among constituent members of the embodiment of the present invention, for convenience of explanation. Therefore, the present invention may include arbitrary constituent members that are not shown in the drawings referred to hereinafter. Further, the dimensions of the members shown in the drawings do not faithfully reflect actual dimensions of constituent members, dimensional ratios of the members, etc.

Embodiment 1

An example in which the present invention is applied to a reflection-type liquid crystal display panel in which polymer dispersion liquid crystal is used is shown as Embodiment 1. FIG. 1 is a plan view showing a schematic configuration of a liquid crystal display panel 1 with a touch sensor function according to Embodiment 1.

The liquid crystal display panel 1 includes a display region 11 in which a multiplicity of sub-pixels are arranged in matrix, and a frame region 12 around the display region 11. In the frame region 12, there are provided a gate driver 13, a source driver 14, a control section 15, and the like. The gate driver 13 and the source driver 14 may be composed of thin film transistors (TFTs) formed with polysilicon (p-Si) or microcrystalline silicon (μ-Si), whereby they can be formed monolithically. Therefore, by using a flexible sheet (e.g., a resin sheet) as a substrate, a wide region encircled by a dotted line frame 16, for example, has excellent flexibility. The region having the flexibility, however, is not limited to the region encircled by the dotted line frame 16, but any desired area can be set as the region having the flexibility, by appropriately changing the configuration of the substrate, etc.

Figure 2:
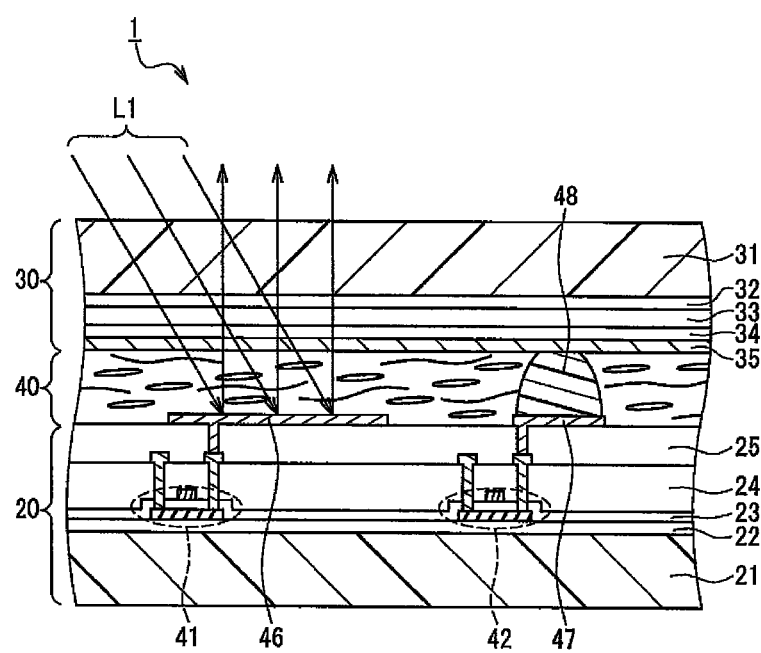
FIG. 2 is a cross-sectional view showing a schematic configuration of the liquid crystal display panel with a touch sensor function according to Embodiment 1 of the present invention.

FIG. 2 is a cross-sectional view showing a schematic configuration of the liquid crystal display panel 1 according to Embodiment 1 of the present invention. The display panel 1 includes an active substrate 20 and a counter substrate 30 that are opposed to each other, and a liquid crystal layer 40 interposed between the active substrate 20 and the counter substrate 30. A surface of the counter substrate 30 on a side opposite to the active substrate 20 side is a display surface, as well as a touch surface touched by a finger or the like.

The active substrate 20 includes a first flexible substrate 21 having flexibility. On a surface of the first flexible substrate 21 on the counter substrate 30 side, a basecoat layer 22, a gate insulation film 23, an interlayer insulation film 24, and a flattening film 25 are laminated in this order. On the flattening film 25, sub-pixel electrodes 46 and electrode pads 47 are formed. Between the basecoat layer 22 and the interlayer insulation film 24, sub-pixel TFTs 41 for driving the sub-pixels and sensor TFTs 42 for touch detection are formed. The sub-pixel TFTs 41 are connected to the sub-pixel electrodes 46. The sub-pixel TFTs 41 function as switching elements for switching potentials of the sub-pixel electrodes 46. The sensor TFTs 42 are connected to the electrode pads 47.

The first flexible substrate 21 can be formed with, for example, a colorless, transparent resin film. The material for the first flexible substrate 21 is not limited particularly; for example, a polyimide resin, a polyester resin (e.g., polyethylene naphthalate), or the like can be used. The thickness of the first flexible substrate 21 is not limited particularly, either, but it can be set to, for example, 8 to 20 μm.

The flattening film 25 can be omitted. In the case where the flattening film 25 is omitted, the sub-pixel electrodes 46 and the electrode pads 47 are formed on the interlayer insulation film 24.

The counter substrate 30 includes a second flexible substrate 31 having flexibility. On a surface of the counter substrate 30 on the active substrate 20 side, a protective film 32, a color filter layer 33, a transparent layer 34, and a counter electrode 35 are formed in the stated order. It should be noted that the protective film 32 can be omitted.

The second flexible substrate 31 can be formed with, for example, a colorless, transparent resin film. The material for the second flexible substrate 31 is not limited particularly; for example, a polyimide resin, a polyester resin (e.g., polyethylene naphthalate), or the like can be used. The thickness of the second flexible substrate 31 is not limited particularly, either, but it can be set to, for example, 8 to 20 μm.

The color filter layer 33 is composed of color layers of three types that selectively transmit light in wavelength bands of primary colors of red (R), green (G), and blue (B), respectively, and a black matrix provided between adjacent color layers. Each color layer is made of a resin film. The black matrix is a light shielding film formed with a metal such as Cr (chromium) or a black resin. In a region where a pressure-sensitive conductive resin 48 to be described later is formed, the black matrix is formed.

The counter electrode 35 is formed continuously in a region facing the region (display region 11 in FIG. 1) of the active substrate 20 where the sub-pixel electrodes 46 are formed.

The pressure-sensitive conductive resin 48 is provided so as to connect the electrode pads 47 on the active substrate 20 and the counter electrode 35 on the counter substrate 30. The pressure-sensitive conductive resin 48 forms sensor parts that exercise a touch sensor function for detecting a touch of a finger or a touch pen with the display panel 1. The pressure-sensitive conductive resin 48 has a bonding function of adhering to the active substrate 20 and the counter substrate 30 and connect the active substrate 20 and the counter substrate 30 with each other. The pressure-sensitive conductive resin 48 has a spacer function of maintaining the distance (cell gap) between the active substrate 20 and the counter substrate 30 at a predetermined constant value.

The electric resistance of the pressure-sensitive conductive resin 48 varies with a pressure applied to the pressure-sensitive conductive resin 48 (compressive force). For example, preferably, the electric resistance of the pressure-sensitive conductive resin 48 is set to $1 \times 10^7 \Omega$ or more when no pressure is applied, and to $1 \times 10^4 \Omega$ or less when a pressure of 1 kgf (9.8 N) is applied. In the present embodiment, a change in the value of an electric current flowing through the pressure-sensitive conductive resin 48, that is caused to occur by a change in the resistance of the pressure-sensitive conductive resin 48, is detected, whereby a pressure applied to the pressure-sensitive conductive resin 48, that is, a pressure applied to the display panel 1 (touch pressure), is detected.

As the pressure-sensitive conductive resin 48, a base resin containing conductive particles as a filler can be used. As the base resin, a resin having elasticity such as silicone, urethane, or polyimide can be used. Among these resins having elasticity, silicone is preferred. As the conductive particles, nanoparticles such as particles of carbon, Ag, Ni, etc. can be used.

Among these types of nanoparticles, Ag is preferred since it makes it possible to realize pressure-sensitive sensors having high sensitivity.

The pressure-sensitive conductive resin 48 has a coefficient of elasticity of, preferably, 500 MPa or less. If the coefficient of elasticity is greater than 500 MPa, the pressure-sensitive conductive resin 48, when pressed, exhibits smaller deformation with respect to a pressure, and the change is in the electric resistance value is smaller. As a result, the sensitivity thereof as a touch sensor degrades.

The pressure-sensitive conductive resin 48 has an adhesion strength of, preferably, 1 MPa or more, regarding its adhesion to the electrode pads 47 and the counter electrode 35. If the adhesion strength is smaller than 1 MPa, the pressure-sensitive conductive resin 48 tends to separate from the electrode pads 47 or the counter electrode 35 when a force that causes the distance between the active substrate 20 and the counter substrate 30 to increase is exerted onto either the active substrate 20 or the counter substrate 30. As a result, the bonding function of the pressure-sensitive conductive resin 48 degrades.

The liquid crystal layer 40 includes polymer network liquid crystal (PNLC), which is a polymer network containing liquid crystal. Liquid crystal molecules are retained in the polymer network, and when no electric field is applied to the liquid crystal layer 40, the liquid crystal molecules are aligned irregularly along polymer fibers of the polymer network, and a non-transparent display is obtained. On the other hand, when an electric field is applied to the liquid crystal layer 40, the liquid crystal molecules are aligned in the thickness direction (direction perpendicular to the active substrate 20 and the counter substrate 30), and therefore, a transparent display is obtained. The material of the polymer network liquid crystal is not limited particularly, and for example, a known material (e.g., JP5(1993)-281521A) can be used. For example, by mixing liquid crystal and a photopolymerization initiator are mixed in a polymerizable monomer and irradiating the same with ultraviolet rays, a polymer network can be formed. The polymerization method is not limited to photopolymerization, but a known method such as thermal polymerization, plasma polymerization, or the like can be used.

The thickness of the liquid crystal layer 40 (the distance between the active substrate 20 and the counter substrate 30, i.e., the cell gap) is not limited particularly, but it may be set to, for example, about 5 μm.

Figure 3:
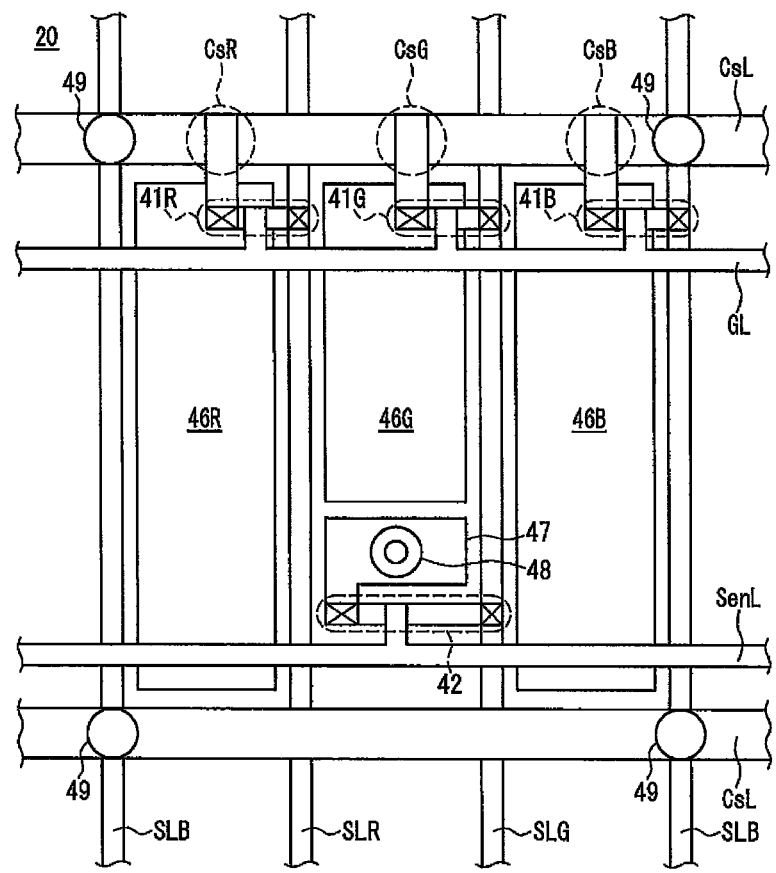
FIG. 3 is a planar perspective view of one pixel part of an active substrate of the liquid crystal display panel with a touch sensor function according to Embodiment 1 of the present invention.
Figure 4:
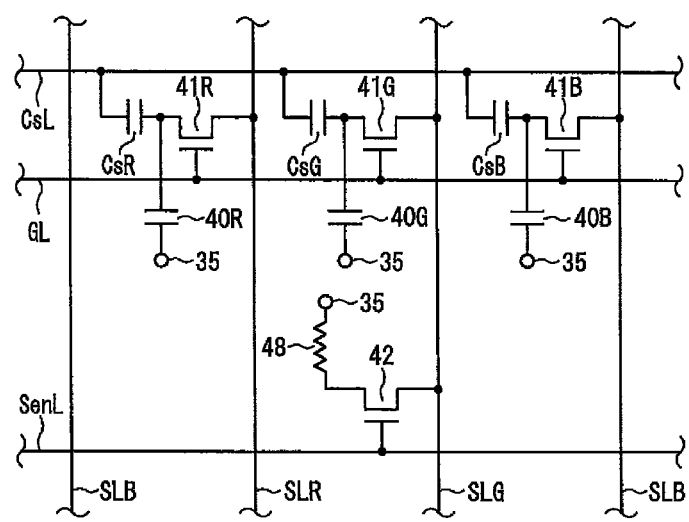
FIG. 4 is an equivalent circuit diagram of one pixel part of the liquid crystal display panel with a touch sensor function according to Embodiment 1 of the present invention.

FIG. 3 is a planar perspective view of one pixel part of the active substrate 20. FIG. 4 is an equivalent circuit diagram of one pixel part of the display panel 1 of the present embodiment. One pixel is composed of three sub-pixels of red (R), green (G), and blue (B). In FIGS. 3 and 4, characters "R", "G", and "B" added to the reference numerals signify their correspondence to the colors of red, green, and blue, respectively.

As shown in the drawings, auxiliary capacitor lines CsL, gate lines (scanning lines) GL, and sensor lines SenL are extended in the horizontal direction, and these are provided repetitively in the vertical direction. The auxiliary capacitor lines CsL, the gate lines GL, and the sensor lines SenL are connected to the gate driver 13 (see FIG. 1). The source lines (signal lines) SLR, SLG, and SLB are extended in the vertical direction, and these are provided repetitively in the horizontal direction. The source lines SLR, SLG, and SLB are connected to the source driver 14 (see FIG. 1). At each of intersections between the gate lines GL and the source lines SLR, SLG, and SLB, a sub-pixel of any of red (R), green (G), and blur (B) is formed.

Each sub-pixel includes the sub-pixel TFT (41R, 41G, or 41B), the liquid crystal element (40R, 40G, or 40B), and an electrostatic capacitor (CsR, CsG, or CsB). Here, each of the liquid crystal elements 40R, 40G, and 40B is composed of the sub-pixel electrode 46, the counter electrode 35, and the liquid crystal layer 40 shown in FIG. 2.

Source regions of the sub-pixel TFTs 41R, 41G, and 41B are connected to the source lines SLR, SLG, and SLB, respectively. Gate electrodes of the sub-pixel TFTs 41R, 41G, and 41B are connected to the gate lines GL. Drain regions of the sub-pixel TFTs 41R, 41G, and 41B are connected to the sub-pixel electrodes 46R, 46G, and 46B of the liquid crystal elements 40R, 40G, and 40B, as well as electrodes on one side of the electrostatic capacitors CsR, CsG, and CsB, respectively. The electrodes on the other side of the electrostatic capacitors CsR, CsG, and CsB are connected to the auxiliary capacitor lines CsL.

Each sensor part that exercises a touch sensor function includes the sensor TFT 42, the electrode pad 47 (see FIG. 2), the pressure-sensitive conductive resin 48, and the sensor line SenL. In the present embodiment, one sensor part is provided at each pixel. More specifically, a source region of the sensor TFT 42 is connected to the electrode pad 47. A gate electrode of the sensor TFT 42 is connected to the sensor line SenL. A drain region of the sensor TFT 42 is connected to the source line SLG.

In FIG. 3, the reference numeral "49" indicates a spacer. In the present embodiment, the spacer 49 is formed at each of positions where the auxiliary capacitor lines CsL and the source lines SLB intersect. The spacer 49 is interposed between the active substrate 20 and the counter substrate 30 in order to keep the distance between the active substrate 20 and the counter substrate 30 (the thickness of the liquid crystal layer 40, i.e., the cell gap) so that the distance does not decrease to a value smaller than a predetermined value. The configuration of the spacer 49 and the method for forming the same are not limited particularly. For example, the spacer 49 may have a configuration that has been known conventionally. The spacer 49 may be formed by a method that has been known conventionally. It should be noted that the pressure-sensitive conductive resin 48 may have a configuration to perform the function of the spacers 49, and the spacers 49 may be omitted.

Operations of the liquid crystal display panel 1 of Embodiment 1 are explained below.

First, a display operation is explained. When a positive pulse is applied to the gate line GL, the sub-pixel TFTs 41R, 41G, and 41B connected to the gate line are turned on. This causes signal voltages applied to the source lines SLR, SLG, and SLB to be sent from the source electrodes of the sub-pixel TFTs 41R, 41G, and 41B via the drain electrodes thereof to the liquid crystal elements 40R, 40G, and 40B and the electrostatic capacitors CsR, CsG, and CsB, respectively. As a result, an electric field is applied to the liquid crystal layer 40 (see FIG. 2) by the sub-pixel electrodes 46R, 46G, and 46B of the liquid crystal elements 40R, 40G, and 40B as well as the counter electrode 35 (see FIG. 2), whereby the liquid crystal molecules of the liquid crystal layer 40 are aligned in the direction perpendicular to the active substrate 20 and the counter substrate 30 (thickness direction). At a sub-pixel where the liquid crystal molecules are aligned in the thickness direction, as shown in FIG. 2, external light L1 passes through the counter substrate 30 and the liquid crystal layer 40, becomes reflected by the sub-pixel electrode 46, again passes through the liquid crystal layer 40 and the counter substrate 30, and goes out of the liquid crystal panel 1. At a sub-pixel where the liquid crystal molecules are not aligned in the thickness direction, the external light L1, after passing through the counter substrate 30, is absorbed in the liquid crystal layer 40. By sequentially applying the positive pulse to the gate lines GL one by one (scanning), a desired color image can be displayed.

Next, an operation as a touch sensor is explained. When a positive pulse is applied to the sensor line SenL, the sensor TFT 42 connected to the foregoing sensor line SenL is turned on. As a result, an electric current flows from the counter electrode 35 to the source line SLG via the pressure-sensitive conductive resin 48, the electrode pad 47, and the sensor TFT 42 thus turned on. When a finger or the like touches an external surface of the counter substrate 30, the counter substrate 30 deforms at the touched position and the distance between the counter substrate 30 and the active substrate 20 decreases there, and the pressure-sensitive conductive resin 48 at the touched position is compressed. As a result, a resistance of the pressure-sensitive conductive resin 48 decreases, and the value of the electric current flowing through the source line SLG increases. By detecting the value of the electric current flowing through each source line SLG, the touched position in the direction in which the sensor lines SenL are extended can be detected. Besides, based on the position of the sensor line SenL to which the positive pulse is applied, the touched position in the direction in which the source lines SLG are extended can be detected. By sequentially applying the positive pulse to the sensor lines SenL one by one (scanning), whether any portion is touched or not in the display region 11, and a touched position, can be detected.

An exemplary method for producing the liquid crystal display panel 1 of the present embodiment formed as described above is explained. The method for producing the liquid crystal display panel 1, however, is not limited to the exemplary method described below.

The liquid crystal display panel 1 is obtained by forming the active substrate 20 and the counter substrate 30 separately, then laminating the active substrate 20 and the counter substrate 30 with each other, and filling liquid crystal between the active substrate 20 and the counter substrate 30.

First, the method for producing the active substrate 20 is explained.

Figure 5A:
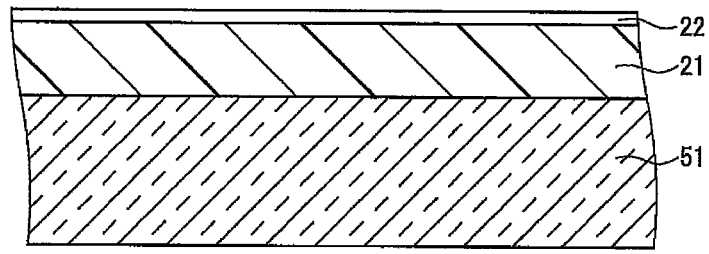
FIG. 5A is a cross-sectional view showing one step in a process of producing the active substrate that composes the liquid crystal display panel with a touch sensor function according to Embodiment 1 of the present invention.

First, as shown in FIG. 5A, a glass substrate 51 having a thickness of about 0.7 mm, for example, is prepared as a support substrate.

Next, the first flexible substrate 21 is laminated on the glass substrate 51. In the case where a polyimide resin is used as a material for the first flexible substrate 21, for example, a solution of a polyamide acid as a precursor of polyimide is coated over the glass substrate 51 and dried, and thereafter it is imidized, whereby the first flexible substrate 21 can be formed. In the case where a polyester resin is used as a material for the first flexible substrate 21, a sheet of a polyester resin having a predetermined thickness, which is formed separately, is laminated on the glass substrate 51 with an adhesive layer being interposed therebetween.

Next, a basecoat layer 22 is formed on the first flexible substrate 21 by, for example, plasma CVD. As the material for the basecoat layer 22, $SiO_2$, SiN, or the like can be used. The basecoat layer 22 may have a thickness of, for example, about 500 nm. The basecoat layer 22 may be a single layer or may be composed of multiple layers made of different materials.

Figure 5B:
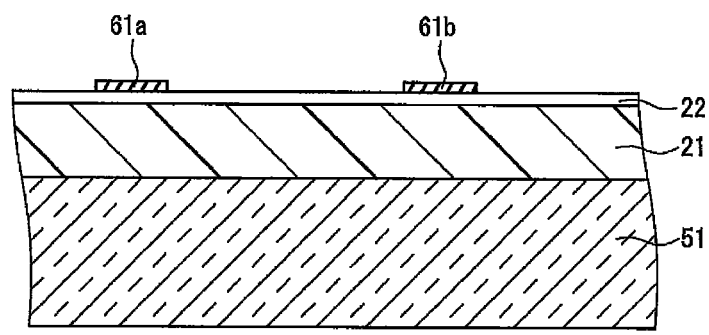
FIG. 5B is a cross-sectional view showing one step in the process of producing the active substrate that composes the liquid crystal display panel with a touch sensor function according to Embodiment 1 of the present invention.

Next, an amorphous semiconductor film is formed over an entire surface of the basecoat layer 22. As a semiconductor forming the amorphous semiconductor film, preferably silicon can be used. Except for silicon, for example, any of semiconductors such as Ge, SiGe, compound semiconductors, and chalcogenide may be used. In the following description, a case where silicon is used is explained. An amorphous silicon film can be formed by a known method, for example, plasma CVD or sputtering, to have a thickness of, for example, about 25 to 100 nm. Subsequently, the amorphous silicon film is crystallized by irradiation with laser light, thereby becoming a polycrystalline silicon film. Subsequently, unnecessary portions of the polycrystalline silicon film are removed so that elements are separated from one another, whereby semiconductor layers 61a and 61b are obtained as shown in FIG. 5B.

Figure 5C:
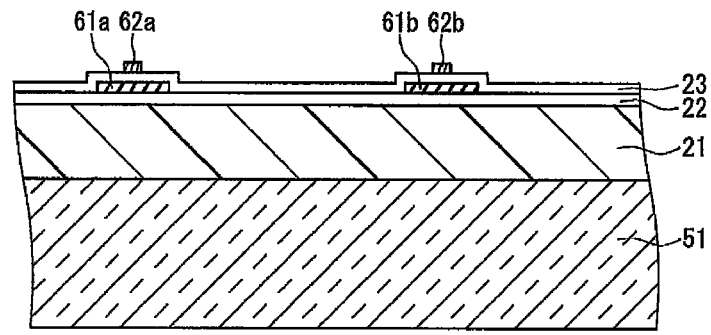
FIG. 5C is a cross-sectional view showing one step in the process of producing the active substrate that composes the liquid crystal display panel with a touch sensor function according to Embodiment 1 of the present invention.

Next, as shown in FIG. 5C, after the gate insulation film 23 is formed so as to cover the semiconductor layers 61a and 61b, which are in an island-like form, gate electrodes 62a of the sub-pixel TFTs 41 and gate electrodes 62b of the sensor TFTs 42 are formed on the gate insulation film 23.

As the material for the gate insulation film 23, $SiO_2$ or SiN, for example, can be used. The gate insulation film 23 preferably has a thickness of 20 to 150 nm.

The gate electrodes 62a and 62b can be formed by depositing a conductive film over an entire surface of the gate insulation film 23 by sputtering or CVD, and patterning the conductive film. As the material for the conductive film, W, Ta, Ti, or Mo, which are high-melting-point metals, or an alloy of any of these materials can be used. The conductive film preferably has a thickness of 300 to 600 nm.

Next, ion-doping with an n-type impurity (e.g., phosphorus) is carried out from above over the entire surface. The n-type impurity goes through the gate insulation film 23 and is doped in the semiconductor layers 61a and 61b. In the semiconductor layers 61a and 61b, regions in which the n-type impurity is doped become source regions and drain regions of the TFTs 41 and 42. Regions that are masked by the gate electrodes 62a and 62b and thereby are not doped with the n-type impurity become channel regions of the TFTs 41 and 42.

Figure 5D:
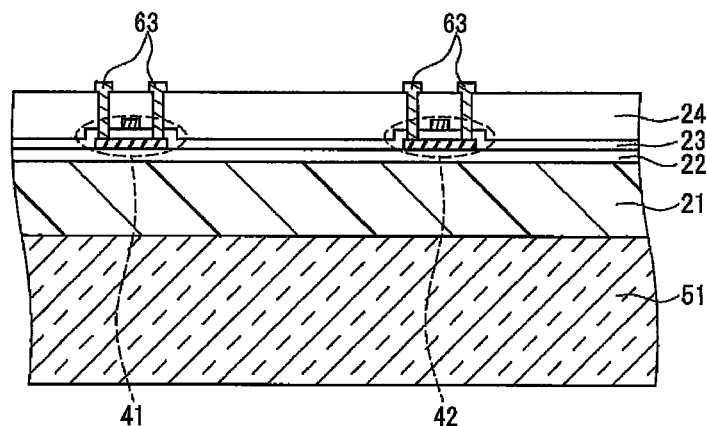
FIG. 5D is a cross-sectional view showing one step in the process of producing the active substrate that composes the liquid crystal display panel with a touch sensor function according to Embodiment 1 of the present invention.

Next, as shown in FIG. 5D, the interlayer insulation film 24 is formed over an entire surface of the gate insulation film 23. As the interlayer insulation film 24, for example, a TEOS film, a SiN film, or the like can be used. Thereafter, contact holes are formed in the interlayer insulation film 24, and metal lines 63 that are electrically connected to the source regions and the drain regions of the TFTs 41 and 42 are formed.

Figure 5E:
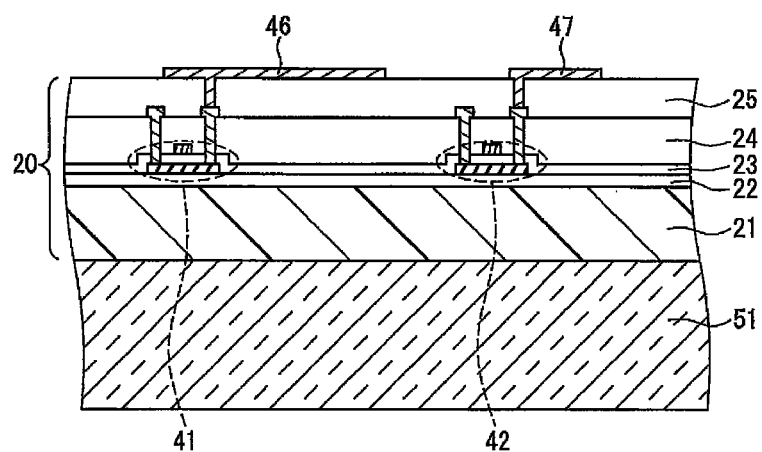
FIG. 5E is a cross-sectional view showing one step in the process of producing the active substrate that composes the liquid crystal display panel with a touch sensor function according to Embodiment 1 of the present invention.

Next, as shown in FIG. 5E, the flattening film 25 is formed over an entire surface of the interlayer insulation film 24. As the flattening film 25, like the interlayer insulation film 24, for example, a TEOS film, a SiN film, or the like can be used. Thereafter, contact holes are formed in the flattening film 25, and the sub-pixel electrodes 46 and the electrode pads 47 that are electrically connected to the metal lines 63 are formed. Thus, the active substrate 20 is obtained.

Figure 5F:
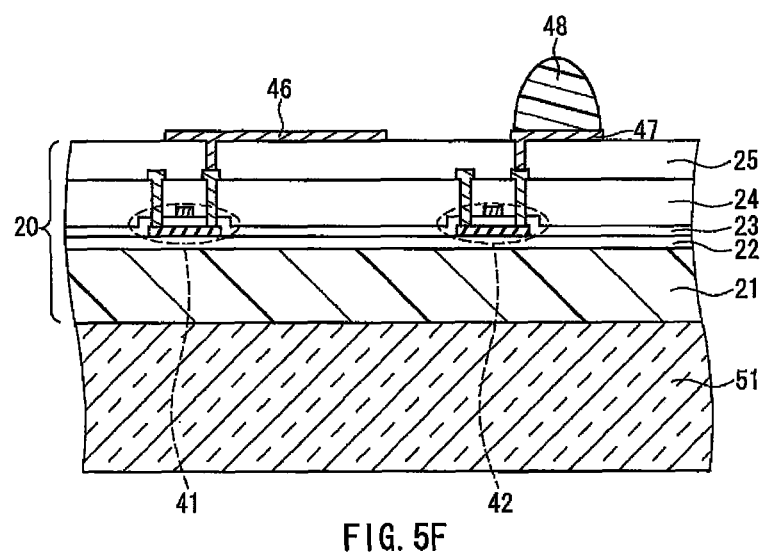
FIG. 5F is a cross-sectional view showing one step in the process of producing the active substrate that composes the liquid crystal display panel with a touch sensor function according to Embodiment 1 of the present invention.

Next, as shown in FIG. 5F, the pressure-sensitive conductive resin 48 is formed so as to rise up on each electrode pad 47. The method for applying the pressure-sensitive conductive resin 48 on the electrode pads 47 is not limited particularly, and may be selected appropriately with properties of the pressure-sensitive conductive resin 48 and the like being taken into consideration. The preferred method is a method that allows a desired amount of the pressure-sensitive conductive resin to be applied to a desired height exactly on the electrode pads 47 without displacement.

Figure 6A:
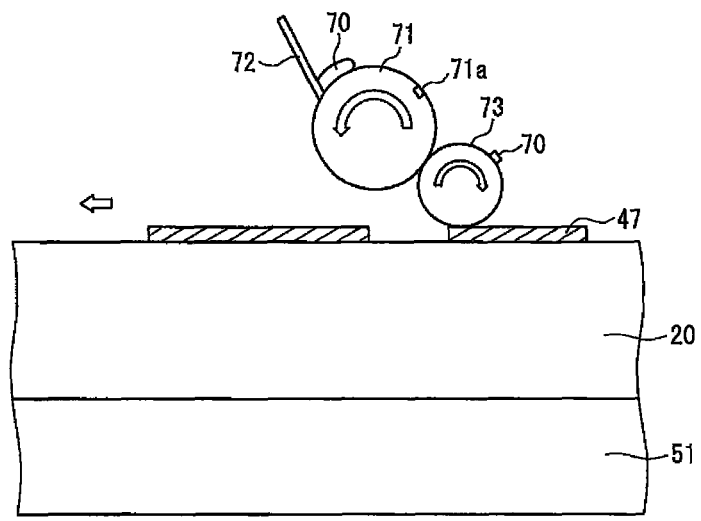
FIG. 6A is a schematic view showing a method for applying a pressure-sensitive conductive resin over electrode pads on the active substrate by offset printing, in Embodiment 1 of the present invention.

For example, as shown in FIG. 6A, the pressure-sensitive conductive resin 48 may be applied on the electrode pads 47 by offset printing. More specifically, with a scraper 72, a predetermined amount of a pressure-sensitive conductive resin material 70 is retained in recesses 71a that are formed in a predetermined pattern around a circumferential outer surface of a gravure roller 71 that rotates. The pressure-sensitive conductive resin material 70 in the recesses 71a is transferred onto a circumferential outer surface of a blanket roller 73, and further, onto the electrode pads 47 of the active substrate 20.

Figure 6B:
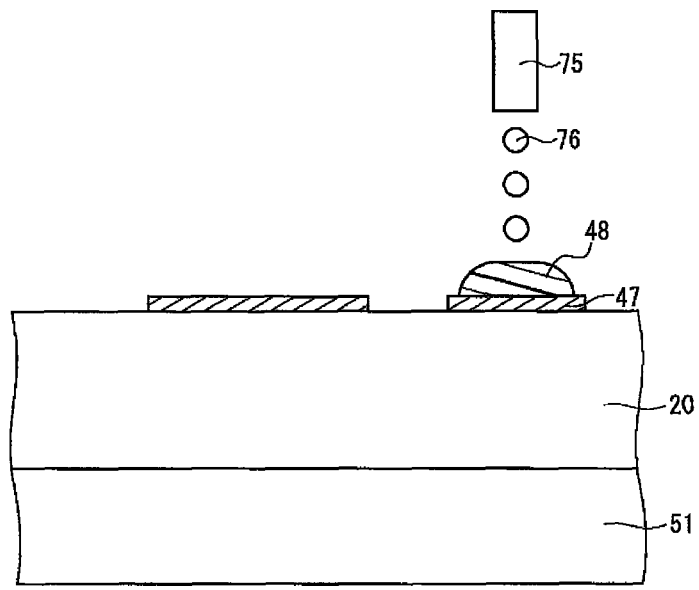
FIG. 6B is a schematic view showing a method for applying a pressure-sensitive conductive resin over electrode pads on the active substrate by inkjet printing, in Embodiment 1 of the present invention.

Alternatively, as shown in FIG. 6B, the pressure-sensitive conductive resin 48 may be applied onto the electrode pads 47 by inkjet printing. More specifically, a pressure-sensitive conductive resin material 76 is jetted in a droplet form from an inkjet nozzle 75, and is applied onto the electrode pads 47 on the active substrate 20. Here, the printing may be carried out while the active substrate 20 is kept still, or may be carried out while the active substrate 20 is being moved.

Except for the above-described printing, screen printing, gravure printing, or the like may be used.

After the pressure-sensitive conductive resin 48 is applied on the electrode pads 47, a heat treatment, for example, at 100 to 120° C. for several minutes (temporary calcination) is carried out.

Next, a method for producing the counter substrate 30 is explained.

Figure 7A:
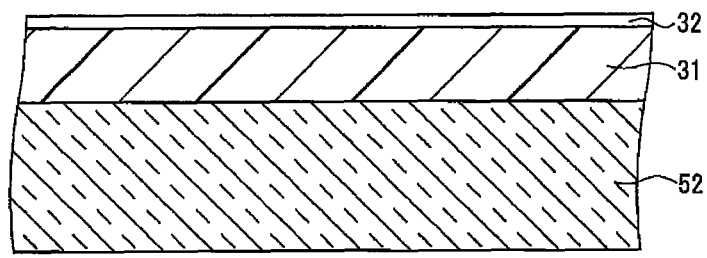
FIG. 7A is a cross-sectional view showing one step in a process of producing a counter substrate that composes the liquid crystal display panel with a touch sensor function according to Embodiment 1 of the present invention.

First, as shown in FIG. 7A, a glass substrate 52 having a thickness of about 0.7 mm, for example, is prepared as a support substrate.

Next, the second flexible substrate 31 is laminated on the glass substrate 52. In the case where a polyimide resin is used as a material for the second flexible substrate 31, for example, a solution of a polyamide acid as a precursor of polyimide is coated over the glass substrate 52 and dried, and thereafter it is imidized, whereby the second flexible substrate 31 can be formed. In the case where a polyester resin is used as a material for the second flexible substrate 31, a sheet of a polyester resin having a predetermined thickness, which is formed separately, is laminated on the glass substrate 52 with an adhesive layer being interposed therebetween.

Next, a protective film 32 is formed on the second flexible substrate 32 by, for example, plasma CVD. As the material for the protective film 32, $SiO_2$, SiON, SiNx, or the like can be used. The thickness of the protective film 32 may be set to, for example, about 500 nm.

Figure 7B:
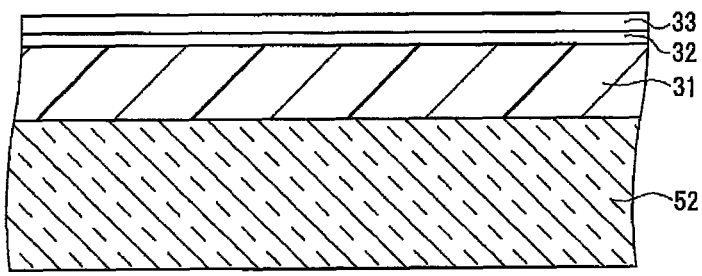
FIG. 7B is a cross-sectional view showing one step in the process of producing the counter substrate that composes the liquid crystal display panel with a touch sensor function according to Embodiment 1 of the present invention.

Next, as shown in FIG. 7B, the color filter layer 33 is formed on the protective film 32. First, a black matrix is formed in a predetermined pattern on the protective film 32. Subsequently, color layers of red, green, and blue are formed in areas where the black matrix is not provided.

Figure 7C:
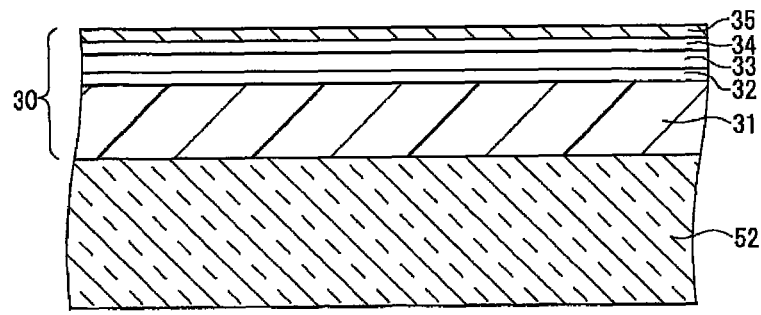
FIG. 7C is a cross-sectional view showing one step in the process of producing the counter substrate that composes the liquid crystal display panel with a touch sensor function according to Embodiment 1 of the present invention.

Next, as shown in FIG. 7C, the transparent layer 34 is formed on the color filter layer 33. As the material for the transparent layer 34, for example, an acrylic resin, $SiO_2$, or the like can be used. The thickness of the transparent layer 34 can be set to, for example, about 1 to 3 μm.

Next, the counter electrode 35 is formed on the transparent layer 34. As the counter electrode 35, a transparent conductor such as ITO (indium-tin oxide) or IZO (indium-zinc oxide), for example, can be used. The counter electrode 35 can be formed by sputtering.

Figure 8A:
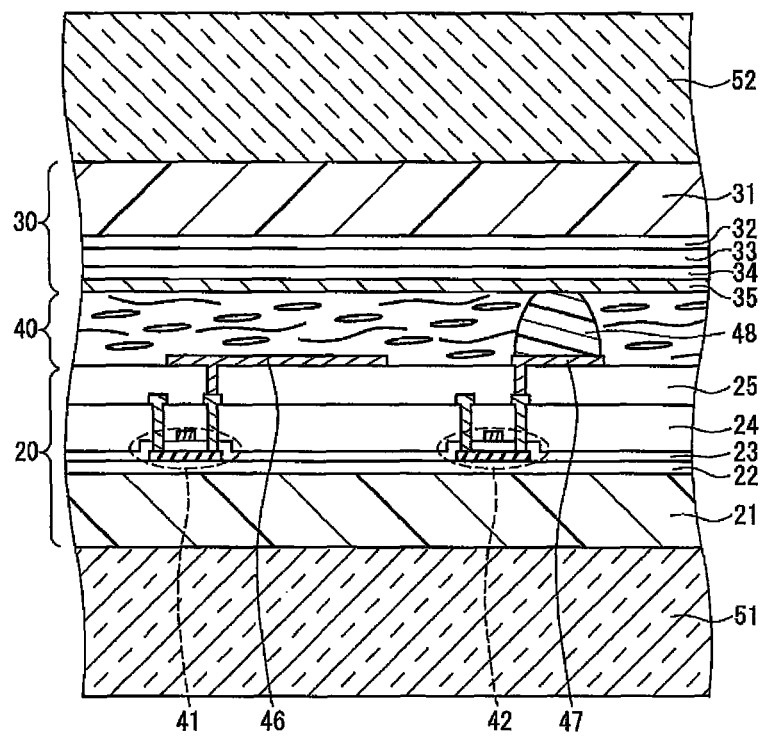
FIG. 8A is a cross-sectional view showing a step of laminating the active substrate and the counter substrate that compose the liquid crystal display panel with a touch sensor function according to Embodiment 1 of the present invention.

Next, as shown in FIG. 8A, the active substrate 20 obtained as shown in FIG. 5F and the counter substrate 30 obtained as shown in FIG. 7C are laminated in a state in which the surface of the active substrate 20 on which the sub-pixel electrodes 46 and the electrode pads 47 are formed faces the surface of the counter substrate 30 on which the counter electrode 35 is formed. Prior to the lamination, along the circumference of the surface of the active substrate 20 or the counter substrate 30 that is to be subject to lamination, a sealing material in a frame form having an opening is formed. Through the lamination, the sealing material closely adheres to the active substrate 20 and the counter substrate 30, and the pressure-sensitive conductive resin 48 closely adheres to the counter electrode 35.

Subsequently, a liquid of a mixture of a UV curing resin solution, a photopolymerization initiator, and liquid crystal is injected via the opening in the sealing material, and the opening is sealed. Then, it is irradiated with ultraviolet rays from outside. The irradiation of ultraviolet rays causes a photopolymerization reaction in the resin, and the resin forms a polymer network. Phase separation occurs to the liquid crystal, and the liquid crystal is dispersed in the polymer network.

Thereafter, a heat treatment, for example, at 120 to 180° C. for 60 minutes (main calcination) is carried so as to cause the sealing material and the pressure-sensitive conductive resin 48 to adhere to the active substrate 20 and the counter substrate 30.

Figure 8B:
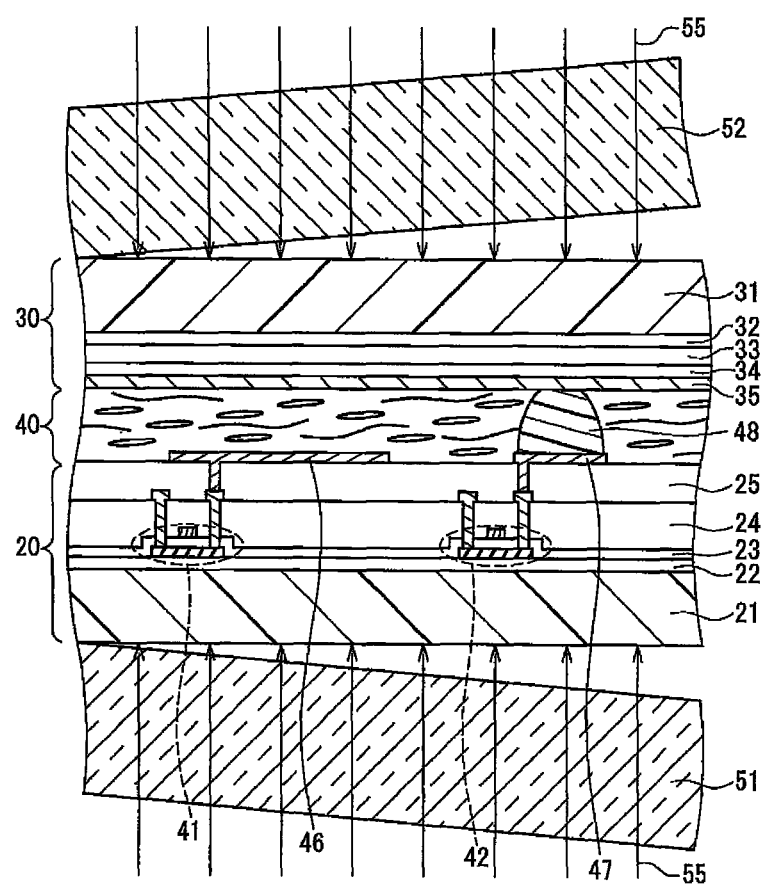
FIG. 8B is a cross-sectional view showing a step of removing glass substrates as support substrates that are laminated with the active substrate and the counter substrate, in the method for manufacturing the liquid crystal display panel with a touch sensor function according to Embodiment 1 of the present invention.

Next, as shown in FIG. 8B, laser light 55 is projected to the glass substrates 51 and 52 from the sides of the external surface thereof, so that the glass substrates 51 and 52 are separated from the active substrate 20 and the counter substrate 30, and are removed. It should be noted that the method for removing the glass substrates 51 and 52 is not limited to the method of separation by laser light projection, and the glass substrates 51 and 52 may be removed, for example, by grinding with a grinding machine.

Thus, the liquid crystal display panel 1 of Embodiment 1 is obtained.

As described above, in the liquid crystal display panel 1 of Embodiment 1, the pressure-sensitive conductive resin 48 for exercising a touch sensor function is provided in the liquid crystal layer 40. In other words, the touch sensors are formed as in-cell touch sensors provided between the flexible substrates 21 and 31. Therefore, the liquid crystal display panel 1, having substantially the same thickness (e.g., about 50 μm) as the thickness of the conventional flexible reflection-type liquid crystal display panel in which polymer network liquid crystal is used, can be allowed to have a touch sensor function. Thus, the liquid crystal display panel 1 has high flexibility, and hence, can be rolled into a cylindrical form or folded, for example. Thus, the portability thereof is improved.

In addition to the touch sensor function, the pressure-sensitive conductive resin 48 also has a bonding function for bonding the active substrate 20 and the counter substrate 30 with each other, and a spacer function for keeping substantially constant the distance (cell gap) between the active substrate 20 and the counter substrate 30. Therefore, if the liquid crystal display panel 1 is bent, displacement does not occur to the active substrate 20 and the counter substrate 30. Besides, the thickness (cell gap) of the liquid crystal layer 40 is kept substantially constant, with substantially no change. Therefore, high display quality can be obtained stably. Further, it is possible to cause the pressure-sensitive conductive resin 48 to exercise the spacer function that the spacers (spacers 49 in FIG. 3) would exercise, and to omit the spacers, by appropriately setting the coefficient of elasticity of the pressure-sensitive conductive resin 48, the density of the same arranged, and the like.

The configuration of the liquid crystal display panel 1 of Embodiment 1 is not limited particularly, except for the sensor parts composed of the sensor TFTs 42, the electrode pads 47, the pressure-sensitive conductive resin 48, the sensor lines SenL, and the like. The configuration thereof may be identical to, for example, the configuration of the conventionally known reflection-type display panel in which the polymer network liquid crystal is used. In other words, a liquid crystal display panel with a touch sensor function can be realized by only a slight design change of, for example, addition of the aforementioned sensor parts to the conventionally known reflection-type liquid crystal display panel having flexibility in which the polymer network liquid crystal is used. The addition of the sensor parts causes substantially no change in the flexibility of the liquid crystal display panel. Besides, the addition of the sensor parts requires only insignificant addition and change in the manufacturing process. As a result, the liquid crystal display panel with a touch sensor function can be manufactured through the process for manufacturing the conventional liquid crystal display panel having flexibility, without significant changes in the process.

In the manufacturing method described above, since the first and second flexible substrates 21 and 22 can be supported by the glass substrates 51 and 52, even if thin sheets are used as the first and second flexible substrates 21 and 22, the handling property (handleability) of the first and second flexible substrates 21 and 22 do not deteriorate. In other words, there is no need to increase the thicknesses of the first and second flexible substrates 21 and 22 in order to ensure the handleability of the first and second flexible substrates 21 and 22 in the manufacturing process. Therefore, a thin and highly flexible liquid crystal display panel having a touch sensor function can be realized.

The above-described embodiment is explained with reference to an example that uses polymer network liquid crystal (PNLC) in which liquid crystal is contained in a polymer network, as polymer dispersion liquid crystal that composes the liquid crystal layer 40. Alternatively, however, a so-called guest-host liquid crystal in which microcapsules containing liquid crystal are dispersed in a polymer material (see U.S. Pat. No. 4,435,047, and JP 5(1993)-216017A) may be used instead.

In the above-described embodiment, the pressure-sensitive conductive resin 48 is provided with respect to one pixel composed of three sub-pixels of red, green, and blue, but the present invention is not limited to this configuration. For example, the pressure-sensitive conductive resin 48 may be provided with respect to a plurality of pixels. Alternatively, the pressure-sensitive conductive resin 48 may be provided with respect to each of the sub-pixels of red, green, and blue. Further, the above-described embodiment is explained with reference to an example in which the present invention is applied to a liquid crystal panel that performs color display, but the present invention can be applied to a liquid crystal panel that performs monochrome display.

Embodiment 2

As Embodiment 1, the reflection-type liquid crystal display panel 1 is explained. Here, as Embodiment 2, an example in which the present invention is applied to a transmission-type liquid crystal display panel is explained. An overall configuration of the display panel of Embodiment 2 is substantially identical to that shown in FIG. 1 in conjunction with Embodiment 1 described above.

Figure 9:
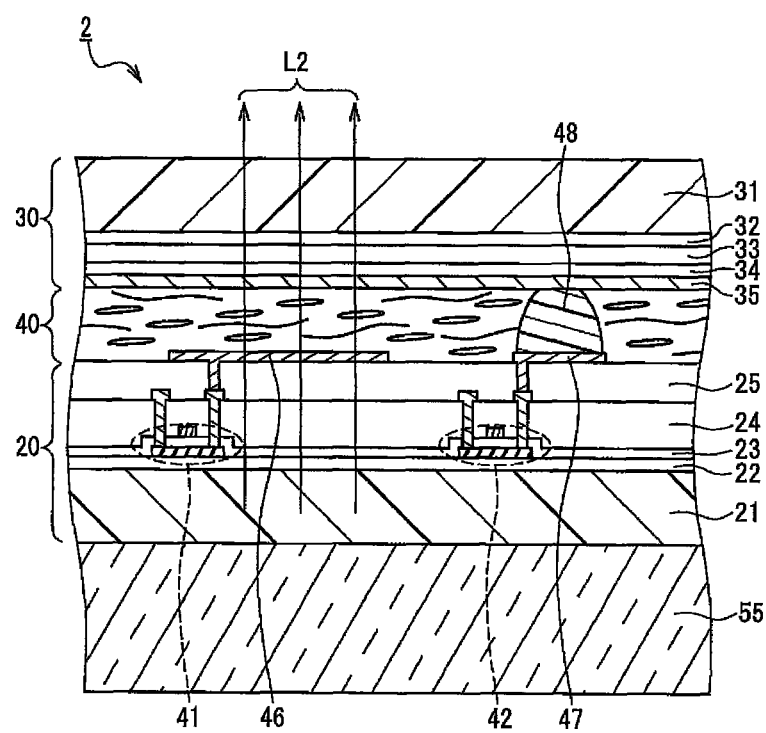
FIG. 9 is a cross-sectional view showing a schematic configuration of a liquid crystal display panel with a touch sensor function according to Embodiment 2 of the present invention.

FIG. 9 is a cross-sectional view showing a schematic configuration of a liquid crystal display panel 2 with a touch sensor function according to Embodiment 2. The constituent elements corresponding to the constituent elements shown in FIG. 2 showing the liquid crystal display panel 1 of Embodiment 1 are denoted by the same reference numerals, and detailed descriptions of the constituent elements are omitted.

The display panel 2 of Embodiment 2 includes an active substrate 20 and a counter substrate 30 that are arranged so as to face each other, and also includes a liquid crystal layer 40 interposed between the active substrate 20 and the counter substrate 30, as is the case with the display panel 1 of Embodiment 1 described above. In Embodiment 2, the display panel 2 further includes a flexible backlight (lighting device) 55 that closely adheres to the active substrate 20, on a side of the active substrate 20 opposite to the liquid crystal layer 40. A surface of the counter substrate 30 on a side opposite to the active substrate 20 is a display surface, as well as a touch surface that is touched by a finger or the like.

The configuration of the flexible backlight 55 is not limited particularly, but for example, an edge light type lighting device may be used that includes a light guide plate, an optical sheet laminated on one main surface of the light guide plate, and a light source provided on one side surface of the light guide plate. The light guide plate has flexibility and translucency, and may be formed with, for example, silicone resin. Recesses and projections may be formed on the surface of the light guide plate on the active substrate 20 side, so as to improve the light emission efficiency, or so as to diffuse light. The optical sheet is intended to adjust optical properties of light outgoing from the light guide plate, and is provided between the light guide plate and the active substrate 20. The optical sheet has flexibility, and can be formed with, for example, a diffusion sheet or a prism sheet. As the light source, for example, cold/hot cathode ray tube, or an LED, can be used. Light emitted from the light source is guided by the light guide plate, passes through the optical sheet, and irradiates the active substrate 20.

Illumination light L2 from the flexible backlight 55 passes through the active substrate 20, the liquid crystal layer 40, and the counter substrate 30 sequentially in this order, and is visually observed by an observer. Needless to say, the sub-pixel electrodes 46 and the like are formed with materials having translucency so as to allow the illumination light to pass therethrough.

In the liquid crystal display panel 2 of the present embodiment, a pressure-sensitive conductive resin 48 for exercising a touch sensor function is provided in the liquid crystal layer 40, as is the case with the liquid crystal display panel 1 of Embodiment 1. Further, the flexible backlight 55 has flexibility. Therefore, the liquid crystal panel 1, having only a thickness substantially identical to the thickness of the conventional flexible transmission-type liquid crystal display panel in which polymer network liquid crystal is used, can be allowed to have a touch sensor function. Therefore, the liquid crystal display panel 2 has high flexibility, and can be, for example, rolled into a cylindrical form, or folded.

The configuration of the liquid crystal display panel 2 is not limited particularly except for the sensor parts that exercise a touch sensor function, and may be identical to, for example, the configuration of the conventionally known transmission-type display panel in which polymer network liquid crystal is used. In other words, a liquid crystal display panel with a touch sensor function can be realized by only a slight design change of, for example, addition of the sensor parts to the conventionally-known transmission-type liquid crystal display panel having flexibility in which the polymer network liquid crystal is used. The addition of the sensor parts causes substantially no change in the flexibility of the liquid crystal display panel. Besides, the addition of the sensor parts requires only insignificant addition and change in the manufacturing process. As a result, the liquid crystal display panel with a touch sensor function can be manufactured through the process for manufacturing the conventional liquid crystal display panel having flexibility, without significant changes in the process.

Embodiment 2 is identical to Embodiment 1 except for the above-described points. Besides, Embodiment 2 may be modified in the same manner as that of Embodiment 1 described above.

The transmission-type liquid crystal display panel is explained as Example 2, but the present invention can be applied to a reflection-transmission-type liquid crystal panel.

Embodiment 3

As Embodiment 3, an exemplary case where the present invention is applied to an electrophoretic display panel is explained. The configuration of the electrophoretic display panel is substantially identical to a modified configuration of the liquid crystal display panel 1 of Embodiment 1 described above that is modified by using an electrophoretic layer containing charged particles, in place of the liquid crystal layer 40. An overall configuration of the display panel of Embodiment 3 is substantially identical to that shown in FIG. 1 in conjunction with Embodiment 1 described above.

Figure 10:
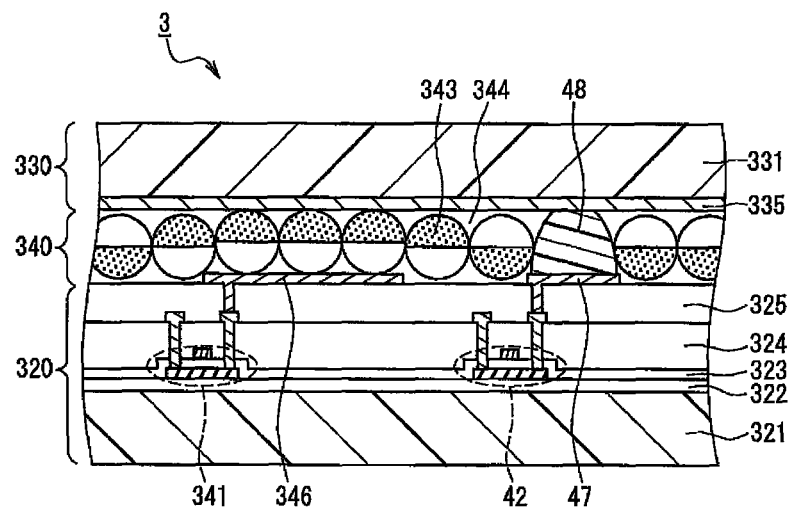
FIG. 10 is a cross-sectional view showing a schematic configuration of an electrophoretic display panel with a touch sensor function according to Embodiment 3 of the present invention.

FIG. 10 is a cross-sectional view showing a schematic configuration of the electrophoretic display panel 3 with a touch sensor function according to Embodiment 3. The constituent elements corresponding to the constituent elements shown in FIG. 2 showing the liquid crystal display panel 1 of Embodiment 1 are denoted by the same reference numerals, and detailed descriptions of the constituent elements are omitted.

The display panel 3 of Embodiment 3 includes an active substrate 320 and a counter substrate 330 that are arranged so as to face each other, and also includes an electrophoretic layer 340 interposed between the active substrate 320 and the counter substrate 330. As is the case with the display panel 1 of Embodiment 1, a pressure-sensitive conductive resin 48 composes sensor parts that exercise a touch sensor function is provided in the electrophoretic layer 340. A surface of the counter substrate 330 on a side opposite to the active substrate 320 is a display surface, and also a touch surface that is touched by a finger or the like.

The active substrate 320 includes a first flexible substrate 321 having flexibility On a surface of the active substrate 320 on the counter substrate 330 side, a basecoat layer 322, a gate insulation film 323, an interlayer insulation film 324, and a flattening film 325 are laminated in this order. On the flattening film 325, sub-pixel electrodes 346 and electrode pads 47 are formed. Between the basecoat layer 322 and the interlayer insulation film 324, sub-pixel TFTs 341 for driving the sub-pixels and sensor TFTs 42 for touch detection are formed. The sub-pixel TFTs 341 are connected to the sub-pixel electrodes 346. The sub-pixel TFTs 341 function as switching elements for switching potentials of the sub-pixel electrodes 346. The sensor TFTs 42 are connected to the electrode pads 47. The sub-pixel electrodes 346 and the electrode pads 47 are arranged in matrix in a display region of the display panel 3 (see the display region 11 in FIG. 1).

The counter substrate 330 includes a second flexible substrate 331 having flexibility. On a surface of the counter substrate 330 on the active substrate 320 side, a counter electrode 335 is formed.

The electrophoretic layer 340 is a microcapsule electrophoretic layer including a multiplicity of microcapsules 343, and an insulative binder 344 for fixing these microcapsules 343. The configuration of the electrophoretic layer 340 is not limited particularly, and, for example, a configuration of a known microcapsule electrophoretic layer can be used.

As each microcapsule 343, the following can be used: a microcapsule made of a transparent resin in which a transparent and insulative dispersion medium, first electrophoretic particles that are charged positively (+), and second electrophoretic particles that are charged negatively (−) are sealed. For example, the first electrophoretic particles may contain carbon black as a black pigment, and the second electrophoretic particles may contain titanium dioxide as a white pigment. The first electrophoretic particles and the second electrophoretic particles are dispersed in the dispersion medium, and electrophoretically move in the dispersant according to an electric field.

There is no particular limitation on a display operation of the display panel 3, and can be performed in the same manner as that of a known display panel having a microcapsule electrophoretic layer. For example, when the potential of the sub-pixel electrode 346 is increased to a level higher than the potential of the counter electrode 335, an electric field directed from the counter electrode 335 to the sub-pixel electrode 346 is formed. Therefore, in the microcapsules 343 provided in this electric field, the first electrophoretic particles in the black color, charged positively (+), move (migrate) to the counter electrode 335, and the second electrophoretic particles in the white color, charged negatively (−), move (migrate) to the sub-pixel electrode 346. Therefore, the sub-pixel where the sub-pixel electrode 346 concerned is provided displays black. In contrast, when the potential of the sub-pixel electrode 346 is decreased to a level lower than the potential of the counter electrode 335, the first electrophoretic particles and the second electrophoretic particles move (migrate) in the directions opposite to the above directions, respectively, in the microcapsule 341, and the sub-pixel where the sub-pixel electrode 346 concerned is provided displays white.

There is no particular limitation on a circuit configuration for performing the above-described display operation, and the configuration may be identical to, for example, that of a known electrophoretic display panel.

In Embodiment 3, each sensor part that exercises a touch sensor function includes the sensor TFT 42, the electrode pad 47, and the pressure-sensitive conductive resin 48, as is the case with Embodiment 1.

The pressure-sensitive conductive resin 48 is provided so as to connect the electrode pads 47 on the active substrate 320 and the counter electrode 335 on the counter substrate 330. The pressure-sensitive conductive resin 48 functions as touch sensors that detect a touch of a finger or a touch pen with the display panel 3. The pressure-sensitive conductive resin 48 has a bonding function of bonding the active substrate 320 and the counter substrate 330. The pressure-sensitive conductive resin 48 has a spacer function of maintaining the distance (cell gap) between the active substrate 320 and the counter substrate 330 at a substantially constant value. The configuration of the pressure-sensitive conductive resin 48 may be identical to, for example, that of Embodiment 1.

The circuit configuration of the sensor part can be identical to that of Embodiment 1. More specifically, a source region of the sensor TFT 42 is connected to the electrode pad 47. A gate electrode of the sensor TFT 42 is connected to a sensor line extended in the horizontal direction in the display region of the display panel 3 (see the sensor lines SenL shown in FIGS. 2 and 3). A drain region of the sensor TFT 42 is connected to a line extended in the vertical direction in the display region. The operation thereof as a touch sensor can be performed in the same manner as in Embodiment 1, and whether any portion is touched or not in the display region, and a touched position, can be detected, in the same manner as in Embodiment 1.

An exemplary method for manufacturing the display panel 3 of the present embodiment is explained. The method for manufacturing the display panel 3, however, is not limited to the exemplary method described below.

The display panel 3 of the present embodiment is obtained by forming the active substrate 320 and the counter substrate 330 separately, as is the case with the liquid crystal display panel 1 of Embodiment 1, then laminating the active substrate 20 and the counter substrate 30 with the electrophoretic layer 340 interposed therebetween.

The active substrate 320 can be formed by laminating the first flexible substrate 321, the basecoat layer 322, the gate insulation film 323, the interlayer insulation film 324, the flattening film 325, the sub-pixel electrodes 346, and the electrode pads 47 in the stated order on a glass substrate, as is the case with the active substrate 20 of Embodiment 1. The sub-pixel TFTs 341 and the sensor TFTs 42 are formed between the basecoat layer 322 and the interlayer insulation film 324, as is the case with the sub-pixel TFTs 41 and the sensor TFTs 42 in Embodiment 1. The pressure-sensitive resin 48 can be formed on the electrode pads 47 by the same method as that in Embodiment 1.

The counter substrate 330 can be formed by laminating the second flexible substrate 331 and the counter electrode 335 in the stated order on a glass substrate, as is the case with the counter substrate 30 of Embodiment 1.

With a roll coater or the like, a solution of a mixture containing the microcapsules 343 and the binder 344 is applied uniformly over a surface of the active substrate 320 on which the sub-pixel TFTs 41 and the sensor TFTs 42 are formed, and is dried, so that the electrophoretic layer 341 is formed. Subsequently, under reduced pressure, the counter substrate 330 is placed on the electrophoretic layer 340. Subsequently, a heat treatment (main calcination) is carried out, so as to cause the pressure-sensitive conductive resin 48 to adhere to the active substrate 320 and the counter substrate 330. Finally, in the same manner as in Embodiment 1, the glass substrates are separated and removed from the active substrate 20 and the counter substrate 30, whereby the display panel 3 of Embodiment 3 is obtained.

In the display panel 3 of the present embodiment, the pressure-sensitive conductive resin 48 for exercising a touch sensor function is provided in the electrophoretic layer 340, as is the case with the liquid crystal display panels 1 and 2 of Embodiments 1 and 2. Therefore, the display panel 3, having only a thickness substantially identical to the thickness of the conventional flexible electrophoretic display panel, can be allowed to have a touch sensor function. Therefore, the display panel 3 has highly flexibility, and can be, for example, rolled into a cylindrical form, or folded.

The pressure-sensitive conductive resin 48 has, in addition to the touch sensor function, the bonding function of bonding the active substrate 320 and the counter substrate 330 with each other, and the spacer function of maintaining the distance (cell gap) between the active substrate 320 and the counter substrate 330 at a substantially constant value. Therefore, if the display panel 3 is bent, displacement does not occur to the active substrate 320 and the counter substrate 330. Besides, the thickness (cell gap) of the electrophoretic layer 340 is kept substantially constant, with substantially no change. Therefore, high display quality can be obtained stably. Further, it is possible to cause the pressure-sensitive conductive resin 48 to exercise the spacer function that spacers (spacers 49 in FIG. 3) would exercise, and to omit the spacers, by appropriately setting the coefficient of elasticity of the pressure-sensitive conductive resin 48, the density of the same arranged, and the like.

The configuration of the display panel 3 is not limited particularly, except for the sensor parts that exercise a touch sensor function, and may be identical to, for example, the configuration of the conventionally known electrophoretic display panel. In other words, a display panel with a touch sensor function can be realized by only a slight design change of, for example, addition of the sensor parts to the conventionally-known electrophoretic display panel having flexibility. The addition of the sensor parts causes substantially no change in the flexibility of the display panel. Besides, the addition of the sensor parts requires only insignificant addition and change in the manufacturing process. As a result, the display panel with a touch sensor function can be manufactured through the process for manufacturing the conventional electrophoretic display panel having flexibility, without significant changes in the process.

Though Embodiment 3 is described with reference to an exemplary case where the microcapsule electrophoretic type that uses microcapsules in which electrophoretic particles are sealed, the present invention can be applied to the following electrophoretic display panels other than the microcapsule electrophoretic display panel: for example, the vertical-type electrophoretic display panel in which electrophoretic particles move in the electrophoretic layer in the thickness direction thereof, or the horizontal-type (in-plane type) electrophoretic display panel in which electrophoretic particles move in the electrophoretic layer in the horizontal direction (in a direction parallel with the active substrate 20 and the counter substrate 30).

Embodiment 4

As Embodiment 4, an exemplary case where the present invention is applied to an organic EL (electro-luminescence) display panel is explained. An overall configuration of the display panel of Embodiment 4 is substantially identical to that shown in FIG. 1 in conjunction with Embodiment 1 described above.

Figure 11:
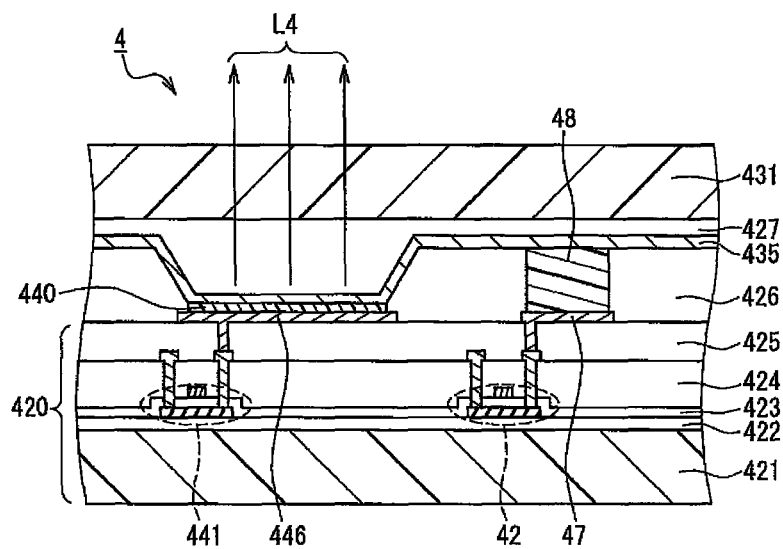
FIG. 11 is a cross-sectional view showing a schematic configuration of an organic EL display panel with a touch sensor function according to Embodiment 4 of the present invention.

FIG. 11 is a cross-sectional view showing a schematic configuration of an organic EL display panel with a touch sensor function according to Embodiment 4. The constituent elements corresponding to the constituent elements shown in FIG. 2 showing the liquid crystal display panel 1 of Embodiment 1 are denoted by the same reference numerals, and detailed descriptions of the constituent elements are omitted.

As shown in FIG. 11, a first flexible substrate 421 and a second flexible substrate 431, each of which has flexibility, are arranged so as to face each other. A surface of the second flexible substrate 431 on a side opposite to the first flexible substrate 421 is a display surface, as well as a touch surface that is touched by a finger or the like.

On a surface of the first flexible substrate 421 on the second flexible substrate 431 side, a basecoat layer 422, a gate insulation film 423, an interlayer insulation film 424, and a flattening film 425 are laminated in this order. On the flattening film 425, sub-pixel electrodes 446 and electrode pads 47 are formed. Between the basecoat layer 422 and the interlayer insulation film 424, sub-pixel TFTs 441 for driving the sub-pixels and sensor TFTs 42 for touch detection are formed. The sub-pixel TFTs 441 are connected to the sub-pixel electrodes 446. The sub-pixel TFTs 441 function as switching elements for switching potentials of the sub-pixel electrodes 446. The sensor TFTs 42 are connected to the electrode pads 47. The sub-pixel electrodes 446 and the electrode pads 47 are arranged in matrix in the display region of the display panel 4 (see the display region 11 of FIG. 1).

In an area of the flattening film 425 where the sub-pixel electrodes 446 and the electrode pads 47 are not formed, a bank layer 426 is formed. The bank layer 426 can be formed with an insulative material such as polyimide or an acrylic resin, but the bank layer 426 is not limited to this configuration. For example, a known configuration as a bank layer for an organic EL display panel can be used.

On the sub-pixel electrodes 446, an organic EL layer 440 is formed. The configuration of the organic EL layer 440 is not limited particularly, and a known configuration as an organic EL layer for an organic EL display panel, for example, can be used. The organic EL layer 440 may have, for example, an electron transport layer, a light emitting layer, a hole transport layer, and a hole injection layer in this order from the sub-pixel electrodes 446 side.

On the electrode pads 47, the pressure-sensitive conductive resin 48 is provided. The pressure-sensitive conductive resin 48 can be provided on the electrode pads 47 where the bank layer 426 is not formed, by the same method as that in Embodiment 1.

On the bank layer 426, the organic EL layer 440, and the pressure-sensitive conductive resin 48, a transparent counter electrode 435 is formed continuously.

The first flexible substrate 421 and the above-described lamination structure on the first flexible substrate 421 can be formed on a glass substrate, like the active substrate 20 of Embodiment 1, for example.

On the counter electrode 435, the second flexible substrate 431 is laminated, with an adhesive layer 427 being interposed therebetween.

In Embodiment 4, each sensor part that exercises a touch sensor function includes the sensor TFT 42, the electrode pad 47, and the pressure-sensitive conductive resin 48, as is the case with Embodiment 1. The pressure-sensitive conductive resin 48 connects the electrode pads 47 and the counter electrode 453, and functions as touch sensors that detect a touch of a finger or a touch pen with the display panel 4. The configuration of the pressure-sensitive conductive resin 48 may be identical to, for example, that of Embodiment 1.

The circuit configuration of the sensor part may be identical to that of Embodiment 1. More specifically, a source region of the sensor TFT 42 is connected to the electrode pad 47. A gate electrode of the sensor TFT 42 is connected to a sensor line extended in the horizontal direction in the display region of the display panel 4 (see the sensor lines SenL shown in FIGS. 2 and 3). A drain region of the sensor TFT 42 is connected to a line extended in the vertical direction in the display region. The operation thereof as a touch sensor can be performed in the same manner as in Embodiment 1, and whether any portion is touched or not in the display region, and a touched position, can be detected, in the same manner as in Embodiment 1.

The organic EL layer 440 is caused to emit a desired color light L4 by applying predetermined voltages to the counter electrode 435 as an anode and the sub-pixel electrode 446 as a cathode. The circuit configuration for the display operation of the display panel 4 is not limited particularly, and may be identical to, for example, that of a known organic EL display panel.

In the display panel 4 of the present embodiment, the pressure-sensitive conductive resin 48 for exercising a touch sensor function is provided between the first flexible substrate 421 and the second flexible substrate 431, as is the case with the display panels 1 to 3 of Embodiments 1 to 3. Therefore, the display panel 4, having substantially the same thickness as the thickness of the conventional flexible organic EL display panel, can be allowed to have a touch sensor function. Thus, the display panel 4 has high flexibility, and hence, can be rolled into a cylindrical form or folded, for example.

The configuration of the display panel 4 is not limited particularly, except for the sensor parts that exercise a touch sensor function, and may be identical to, for example, that of the conventionally known organic EL display panel. In other words, a display panel with a touch sensor function can be realized by only a slight design change of, for example, addition of the sensor parts to the conventionally known organic EL display panel having flexibility. The addition of the sensor parts causes substantially no change in the flexibility of the display panel. Besides, the addition of the sensor parts requires only insignificant addition and change in the manufacturing process. As a result, the display panel with a touch sensor function can be manufactured through the process for manufacturing the conventional organic EL display panel having flexibility, without significant changes in the process.

Embodiment 4 described above is explained with reference to the case where the present invention is applied to the top-emission-type organic EL display panel, but the present invention is not limited to this. The present invention may be applied to, for example, a bottom-emission-type organic EL panel.

Embodiments 1 to 4 are described with reference to the case where the sensor parts are arranged in the display region of the display panel (see the display region 11 shown in FIG. 1), but the present invention is not limited to this. The sensor parts may be arranged, for example, outside the display region.

As described above, the display panel according to an embodiment of the present invention has high flexibility, while having a touch sensor function. Therefore, the display panel according to an embodiment of the present invention can be used for various purposes, by taking advantages of such a characteristic thereof. For example, the display panel, which can be rolled in a cylindrical form or folded, has excellent portability, and moreover, it can be used in a display device capable of inputting information by a touch sensor function. Still further, the touch sensor function of the display panel according to an embodiment of the present invention also can be utilized as a fingerprint sensor. As a result, it can be applied to, for example, a non-contact IC card that performs personal authentication with a fingerprint (see U.S. Pat. No. 7,278,025), a non-contact IC card that has a display function, a touch input function, and a fingerprint sensor function (see JP2002-99886A), a flexible biometric authentication film having a fingerprint sensor, and the like. Besides, the display panel can be modified into a shape that fits a shape of a human body, such as a glove shape, so as to be utilized as an UI device of a body-worn type that is capable of displaying information and inputting information.

The field to which the present invention is applicable is not limited particularly. The present invention, as having a touch sensor function and high flexibility, can be used widely in various fields, such as rollable electronic paper, non-contact IC cards, body-worn UI devices, etc.

The invention claimed is:

1. A flexible display panel with a touch sensor function, comprising a plurality of sub-pixel electrodes arranged in matrix, a counter electrode opposed to the plurality of sub-pixel electrodes, and a pair of flexible substrates opposed to each other with the plurality of sub-pixel electrodes and the counter electrode being interposed therebetween, wherein the display panel performs desired display by controlling respective potentials of the plurality of sub-pixel electrodes with respect to the counter electrode, wherein a pressure-sensitive conductive resin whose electric resistance varies with a compressive force applied thereto is provided between the pair of flexible substrates, a change in a distance between the pair of flexible substrates that occurs according to a pressure applied to one of the pair of flexible substrates is detected based on a value of an electric current flowing through the pressure-sensitive conductive resin, the pressure-sensitive conductive resin is provided in a matrix form, and the pressure-sensitive conductive resin keeps the distance between the pair of flexible substrates at a predetermined value.

2. The flexible display panel with a touch sensor function according to claim 1, wherein the pressure-sensitive conductive resin bonds the pair of flexible substrates.

3. The flexible display panel with a touch sensor function according to claim 1, wherein the display panel is a reflection-type liquid crystal display panel.

4. The flexible display panel with a touch sensor function according to claim 1, wherein the display panel is a transmission-type liquid crystal display panel.

5. The flexible display panel with a touch sensor function according to claim 4, wherein one of the pair of flexible substrates is further provided with a lighting device having flexibility, the lighting device being provided on a side opposite to the other flexible substrate side.

6. The flexible display panel with a touch sensor function according to claim 1, wherein polymer dispersion liquid crystal is provided between the plurality of sub-pixel electrodes and the counter electrode.

7. The flexible display panel with a touch sensor function according to claim 1, wherein the display panel is an electrophoretic display panel.

8. The flexible display panel with a touch sensor function according to claim 1, wherein the display panel is an organic EL display panel.

9. The flexible display panel with a touch sensor function according to claim 1, wherein the pressure-sensitive conductive resin is disposed at a position different from positions of the plurality of sub-pixel electrodes.

* * * * *